(12) United States Patent
Zivic

(10) Patent No.: US 6,316,819 B1
(45) Date of Patent: Nov. 13, 2001

(54) MULTILAYER ZNO POLYCRYSTALLINE DIODE

(75) Inventor: Zoran Zivic, Medvode (SI)

(73) Assignee: Keko-Varicon, Zuzemberk (SI)

( * ) Notice: Subject to any disclaimer, the term of this patent is extended or adjusted under 35 U.S.C. 154(b) by 0 days.

(21) Appl. No.: 09/101,520
(22) PCT Filed: Nov. 10, 1997
(86) PCT No.: PCT/SI97/00029
   § 371 Date: Nov. 13, 1998
   § 102(e) Date: Nov. 13, 1998
(87) PCT Pub. No.: WO98/21754
   PCT Pub. Date: May 22, 1998

(30) Foreign Application Priority Data

Nov. 11, 1996  (SI) ................................ 9600331

(51) Int. Cl.[7] .................................. H01L 29/93
(52) U.S. Cl. .................. 257/595; 257/599; 257/653
(58) Field of Search .......................... 257/595, 599, 257/603, 613, 653, 532, 534, 537

(56) References Cited

U.S. PATENT DOCUMENTS

| | | | |
|---|---|---|---|
| 4,165,351 | * | 8/1979 | May ............................ 264/66 |
| 4,290,041 | * | 9/1981 | Utsumi et al. ............... 338/21 |
| 4,510,112 | * | 4/1985 | Lauf ............................. 264/234 |
| 4,527,146 | * | 7/1985 | Kanai et al. ................. 338/20 |
| 4,729,058 | * | 3/1988 | Gupta et al. ................ 361/321 |
| 4,811,164 | * | 3/1989 | Ling et al. .................. 361/321 |
| 4,959,262 | * | 9/1990 | Charles et al. .............. 428/329 |
| 5,369,390 | * | 11/1994 | Lin et al. .................... 338/1 |

FOREIGN PATENT DOCUMENTS 0 189 987-A1 * 1/1986 (EP) .

OTHER PUBLICATIONS

Dalay, U, et al., "Excess Capacitance of Zn)–Au Varactors," Applied Physics A, 42, 2490255 (1987).*

* cited by examiner

Primary Examiner—Sara Crane
(74) Attorney, Agent, or Firm—Timothy J. Ziolkowski; Cook & Franke SC (57) ABSTRACT

A multilayer ZnO polycrystalline diode that protects against electrostatic discharges, over-current, and voltage surges is provided. The polycrystalline diode includes a block having a plurality of polycrystalline layers in parallel having a first lateral side and a second lateral side. A polycrystalline system is formed by a network of the ZnO diodes. Each diode further includes a plurality of inner electrodes, wherein each inner electrode includes metal and is placed among the plurality of parallel polycrystalline layers, and wherein one end of each inner electrode is placed to alternately terminate at one of the first lateral side and the second lateral side of the block, and wherein the remainder of each inner electrode is surrounded by the parallel polycrystalline layers. A pair of outer electrodes, each including metal and covering each of the first lateral side and the second lateral side of the block are also provided.

28 Claims, 7 Drawing Sheets

MULTILAYER ZNO POLYCRYSTALLINE DIODE

BACKGROUND OF THE INVENTION

Brief Summary of the Invention

A multilayer ZnO polycrystalline diode that protects against electrostatic discharges, over-current, and voltage surges overcoming the aforementioned drawbacks is provided. The present invention further includes a polycrystalline system formed by a network of elementary ZnO diodes; each elementary ZnO diode comprises at least one ZnO grain and a balance layer of $Bi_2O_3$. The balance layer of $Bi_2O_3$ is configured surrounding the at least one ZnO grain and the polycrystalline system is formed into a plurality of layers.

BRIEF DESCRIPTION OF THE DRAWINGS

The drawings illustrate the best mode presently contemplated for carrying out the invention.

In the drawings.

This invention belongs to field of electronic components and more specifically into multifunctional and/or multipurpose electronic elements. Such elements provide simultaneous and independent exploitation of several electric properties, which are result of activity of various physical mechanisms, in common material structure. Even more narrow definition places this invention in the field of polycrystalline semiconductor diodes. Diode of this invention differs from standard planar monocrystalline Si based diodes, as it provides higher capacitance with stable temperature and wide range of frequency properties, which enables the diode to perform condenser function. Capacitance of this newly disclosed diode may be controllable altered, by the means of voltage, which provides similar function as known for varactor diodes (word varactor is developed from variable reactor).

I-U characteristic of the subject diode is not linear and a pulse mode breakthrough is not destructive, which provides similar function as known for Zener protective diodes.

There are four basic problems, from aspect of use of planar Silicon (Si) diodes as protective elements:
1. In voltage range U<4V Si diodes have high leakage current (reverse current) and high negative breakthrough coefficient, which excludes Si diodes from above voltage range, as protective elements.
2. Energy absorption capability of Si protective diodes, at higher voltage, is very limited. This is due the planar construction and small volume of reduced P-N area, where all absorbed energy is concentrated, respectively. Any increase of absorption capability of diodes automatically claims increase of their dimensions, and as result price, which is not in accordance to demands of contemporary electronic in microelectronic.
3. In many various applications, especially when voltage stroke and frequency disturbance appear simultaneous, the protective element shall have capacitance as high as possible. The capacitance of Si Zener diodes is usually small therefore normally condenser is parallely added.
4. Use of Si planar diodes as SMD elements, due their construction, demands mounting in special plastic housings, which additionally increases their dimensions and price.

Technical problem solved with this invention arises from special and general demands of electronics for contemporary protective components.

a) Special demands:
  1. Widest possible operating voltage range of diode
  2. Non-destructive and temperature independent breakthrough
  3. Relatively high capacitance, stable in wide temperature and frequency range
  4. Controllable change of capacitance by means of voltage in whole range of operating voltage
b) General demands
  1. No limit to small and large dimensions
  2. Choice and change of electrical parameters in wide range
  3. Possibility of surface mounting P-N junction and potential barrier on it respectively represents base of functioning of the most elementary active semiconductor two terminal component diode. The most commonly used material for manufacturing semiconductor diodes is silicon monocrystalline. Selective and controlled forming of N, N+ type areas respectively, and P, P+ type respectively is achieved with diffusion or ionic implantation in such manner that the most of formed P-N junction is located in monocrystaline depth, where the surface remains even, thus planar (planar technology). Depending on doping profile, geometry, and polarisation conditions, diode offers various useful functions for different types of applications. Breakthrough I-U characteristic of planar diodes is very non-linear, which provides use of diodes as protective elements against electrostatic discharge and voltage strokes. Namely, at lower voltages, through diode current is very low however, when electric field on P-N junction reaches certain value (about $10^6$ V/cm) diode resistance rapidly decreases and very high current runs through the diode. Such diode behaviour is caused by two different mechanisms: a) tunnel effect; and b) avalanche like multiplication, where the value of breakthrough voltage mostly depends on width of reduced area and dope level respectively of N in P area. Both mechanisms are often very actively used in various fields of application, one of the fields being protection.

Tunnel effect is known for Si diodes, with breakthrough voltage Up<4Eg/q (Eg—semiconductor suppressed band energy, q—elementary charge). As Eg with increasing temperature decreases, such diodes have expressly negative temperature coefficient. Further more, leakage current of such diodes in breakthrough area is very high, which disables them to function as protective elements, especially at DC electronic circuits. If breakthrough voltage Up>6Eg/q than avalanche like multiplication is basic breakthrough mechanism. In such case breakthrough voltage is positive and breakthrough voltage is increasing with temperature. If diode breakthrough voltage 4Eg/q<Up<6Eg/q, both breakthrough mechanisms function at the same time.

Regardless to the fact that capacitance, as result of reduced area of P-N junction, is one of its basic features, diodes are exceptionally used as condenser, however mostly in special cases. This is due to low dielectric constant of silicon ($\in$=11.9), low value of surface capacitance (<10 nF/cm2) and due to limits of planar technology, which are also related to price. Wideness and capacitance of reduced area is directly related to its voltage. This is utilised in varactor diode, where capacitance may be controllable altered with voltage. Because of these properties varactor diodes are widely used in parameter boosters, harmonisation generators, signal mixing systems, detectors and as voltage altered trimmers for precise setting of resonance frequency. Beside high sensitivity (s>3) of temporary varactor diodes with hyper gradient junction in some applications they show deficiency, e.g. relatively low value of nominal capacitance, large dimensions and incapacity of surface mounting. It is obvious that possibilities of planar Si technology are limited, when all demands of contemporary protective electronic components must be fulfilled. This is especially case when necessary for the component to have the highest possible capacitance (e.g. frequency disturbance filtration) or when very high and frequent energy loads are present (electricity in automobiles).

Some of above mentioned problems could be solved using new materials and structures. European patent EP 418394A of Matsushita Company, introduced multilayer condenser based on $SrTiO_3$ semiconductor, which has varistor characteristic. Because of high value of $\in$ (i.e. >15000), such condenser provides very high capacity, varistor function being worse side of this product. Namely in prebreakthrough area varistor characteristic has high leakage current, thus highest operating DC value must 50% lower, compared to varistor breakthrough. Further more non-linearity coefficient α does not exceed value 15, which makes efficiency of the protection very limited. U.S. Pat. No. 4,811,164 introduces condenser—varistor, monolith multilayer component, composed from two different materials in such manner, that one multilayer package is composed from dielectric ceramics based on $BaTiO_3$, having $\in$>10000 and is closely bonded with second multilayer package, made of ZnO varistor ceramics. Both packages are sintered together and from monolith chip component, composed of two different materials, which both maintain their basic condenser and varistor properties, thus they combine these properties in one component. U.S. Pat. No. 4.729.058 introduces self-limiting multilayer condenser, based on multi compound system composed of oxides of the following elements: Zn, alkali metals, B, Co, Si, Bi in Al. In that patent authors T. K. Gupta and W. D. Straub discuss influence of design and mutual disposition of internal electrodes to capacitance and resistance and breakthrough voltage of self-limiting condenser.

DETAILED DESCRIPTION OF THE INVENTION

Subject of present invention is multilayer zinc oxide diode, which is multifunctional component. Multifunctionality of diode of present invention comes out from fact, that beside symmetrical and very non-linear I-U characteristic of ZnO the diode has stable and optional capacitance ranging from some ten pF to some ten nF. Capacitance of ZnO diode may be controllable altered in range from 10% to 30%, with voltage. Key for understanding of operating and construction of ZnO semiconductor diode is in understanding physics and electrical properties of ZnO surface and border line between two ZnO grains, which is also the smallest possible ZnO diode and elementary element for ZnO polycrystalline diode.

Figure 1:
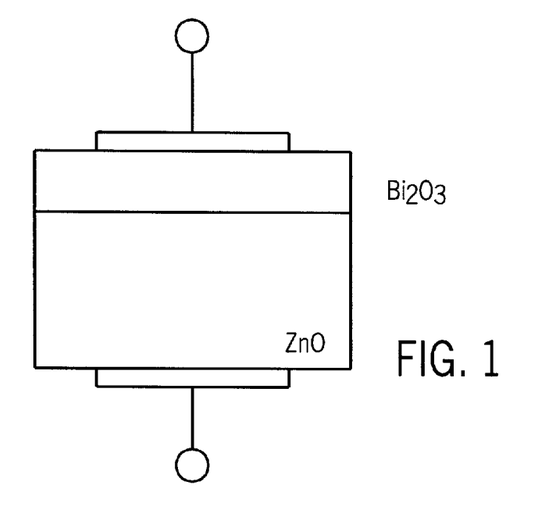
FIG. 1 is a schematic diagram of a preferred embodiment of the present invention.
Figure 2:
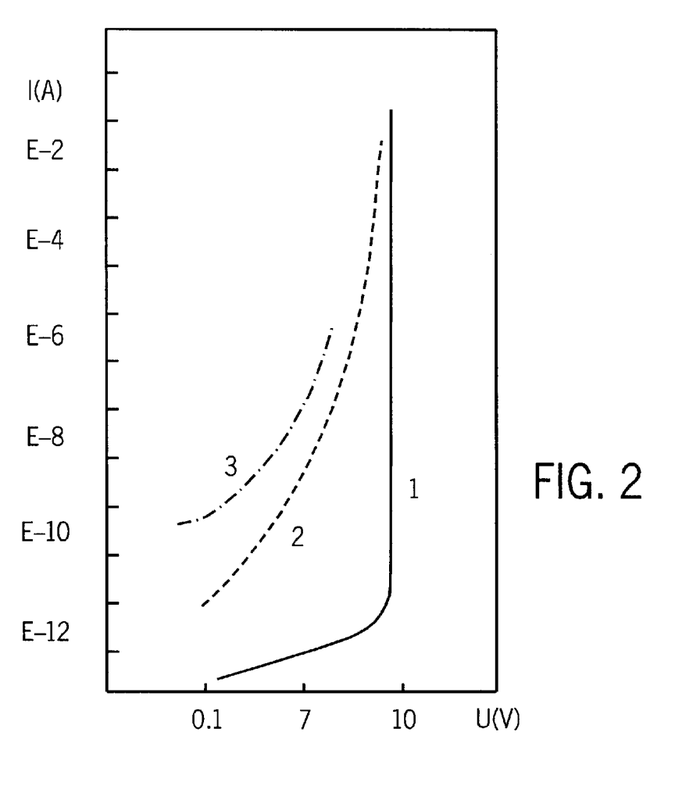
FIG. 2 is a graph illustrating characteristics of the present invention shown in FIG. 1.

ZnO is semiconductor of type N, with free carrier concentration $n=10^{16}$ $cm^{-3}$ and wideness of suppressed band Eg=3.35 eV. $Bi_2O_3$ is basically weak dielectric. These two materials are elemental compositions of ZnO diode. Namely MIS diode (Metal Insulator Semiconductor), with structure as shown in FIG. 1, has extremely non-linear I-U characteristic (α=60–100) in inverse polarisation (1) as shown in FIG. 2, the breakthrough voltage value depending on $Bi_2O_3$ thickness. In direct polarisation (2) I-U characteristic shows much lower non-linear characteristic. $Bi_2O_3$ is known as one of the best ionic conductors, which is confirmed by its I-U characteristic (3) in FIG. 2. When $Bi_2O_3$ is doped with above elements, e.g. Co or rare earth elements, such as Y, Pr, Nb etc., ionic conductivity of $Bi_2O_3$ decreases on account of increased gap conductivity. In both cases electronic conductivity is very low. Thus MIS diode of structure $Bi_2O_3$—ZnO, with inverse polarisation provides good non-linear I-U characteristic.

Figure 3:
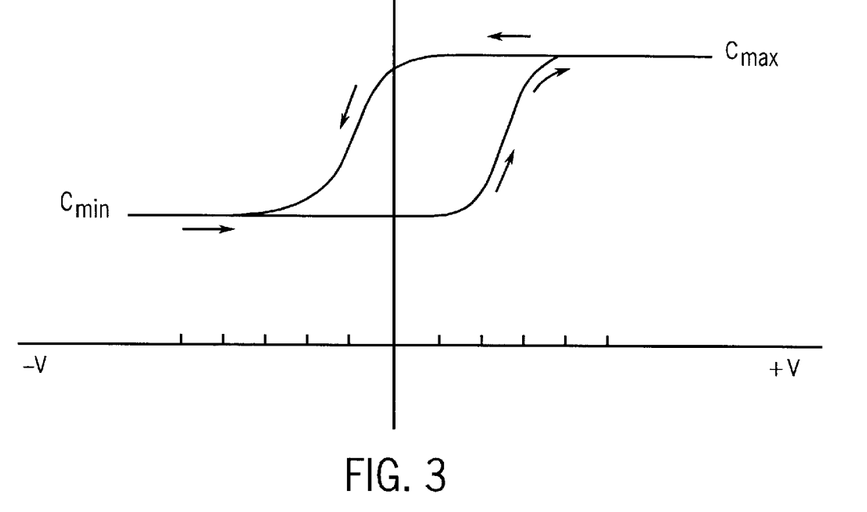
FIG. 3 is a graph further illustrating additional characteristics of the present invention shown in FIG. 1.

C-V characteristic of such diode is shown in FIG. 3. C-V relation proves existence of negative charge on intersurface of $Bi_2O_3$—ZnO and existence of reduced area (=100 nm) on the ZnO side and existence of potential barrier on the border line between $Bi_2O_3$ in ZnO, which is restored to maintain electro neutrality on the border between two systems. Therefore at lower voltage, through current will be low and as a result of thermal ionic emission over the barrier also temperature dependent. Further increase of inverse voltage on MIS diode will result in surface inversion, i.e. gap concentration (minor carriers in ZnO) becomes higher than concentration of electrons. Namely, inverse voltage is divided between dielectric and reduced area, and electrical field on top of the barrier could reach value about 1MV/cm. Under these circumstances the electrons coming over the barrier will gain enough kinetic energy (they become "hot") to initiate shock ionisation and start creating electron-gap pairs. Intersurface gaps compensate part of negative charge and instantly reduce potential barrier, which enables rapid increase of current, i.e. breakthrough.

Voltage at which an inversion is reached, (i.e. breakthrough starting point) is called threshold. Threshold value $V_T$ is from 3.3 and 3.8 V and above all it is function of the $Bi_2O_3$ thickness, charge concentration on intersurface and free carrier concentration in ZnO. Thus not much depending on temperature (i.e.temperature coefficient has small negative value), as experimentally confirmed.

Figure 4:
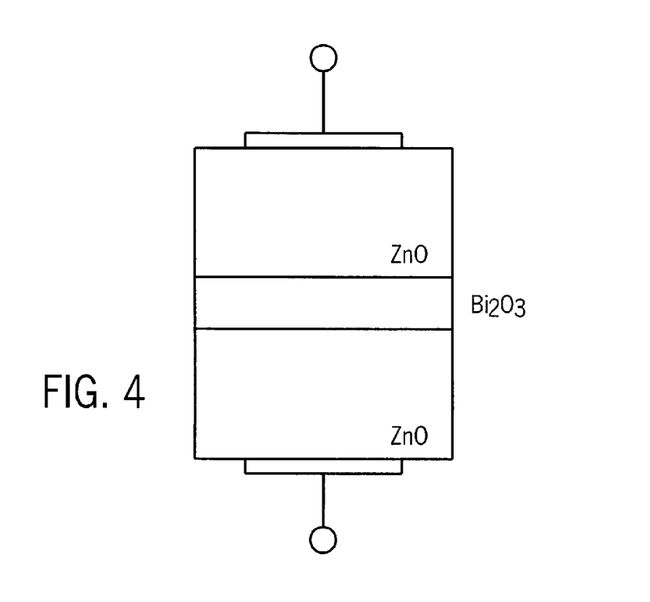
FIG. 4 is a schematic diagram of an alternate embodiment of the present invention.
Figure 5:
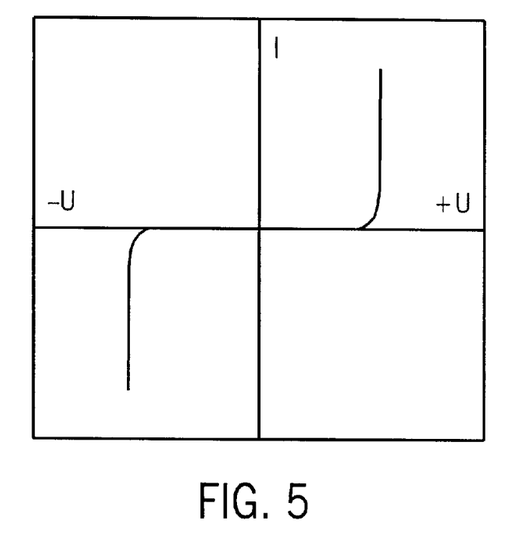
FIG. 5 is a graph illustrating characteristics of the present invention shown in FIG. 4.

To create symmetric, very non-linear I-U characteristic, which would be independent from direction of polarisation, symmetric SIS structure (Semiconductor Insulator Semiconductor) as shown in FIG. 4. In such case, both dielectrics on one and another side form potential barriers with equal properties. Thus, regardless to the direction of polarisation, one of MIS diodes is inverse-polarised, which provides non-linear I-U characteristic in both directions, as shown in FIG. 5. It is obvious, that conductivity of such diodes, influenced by voltage changes rapidly, from very low (at $V<V_T$) up to very high (at $V \geq V_T$) and that in both areas, different conducting mechanisms exist.

Elements having such characteristic (i.e. variable conductivity) may be designated as VARICON (VARiable CONductivity).

Figure 6:
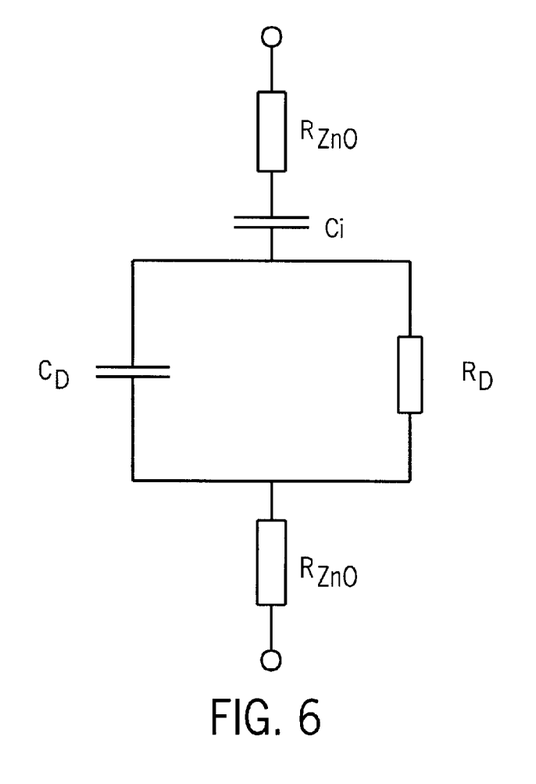
FIG. 6 is a schematic of an equivalent circuit in accordance with the present invention.

Equivalent electric scheme of ZnO diode is shown in FIG. 6, where $R_{ZnO}$ is ZnO resistance, Ci—dielectric capacitance, $R_D$—reduced area resistance and CD—reduced area capacitance. Thus serial connection of number n of such diodes will increase breakthrough voltage of diode equivalent, which may be calculated as $V_n = nV_T$. On the other hand, parallel connection of number n of such diodes increases capacitance of diode equivalent, which may be calculated as $C_N = nC_D$.

A great number of such serial and parallel connections of elementary ZnO diodes are found in polycrystalline system ZnO—$Bi_2O_3$. At heat treatment sintering of dust mixture of these two materials polycrystalline structure is formed, which is composed from grown ZnO grains and surrounding phase of $Bi_2O_3$. Balance layer $Bi_2O_3$ with thickness of 2–10 nm is always formed between two ZnO grains. Thickness of this layer does not dependent on beginning concentration of $Bi_2O_3$, or way of processing. This means that structure of borderline between two grains is repeatable in entire volume of polycrystalline material, which provides great number of primitive ZnO diodes having very similar properties. Due to improvement of electric properties of mentioned materials it is necessary to add some other oxide materials, such as: Mn, Co, Nb, etc., which are $Bi_2O_3$ conductivity modifiers, and regulators of concentration and distribution of surface condition on the border line of ZnO; Fe as concentration regulator of free carriers in ZnO; Sb as regulator of uniformity and ZnO grain growth speed thus porosity regulator of polycrystalline material.

Figure 7:
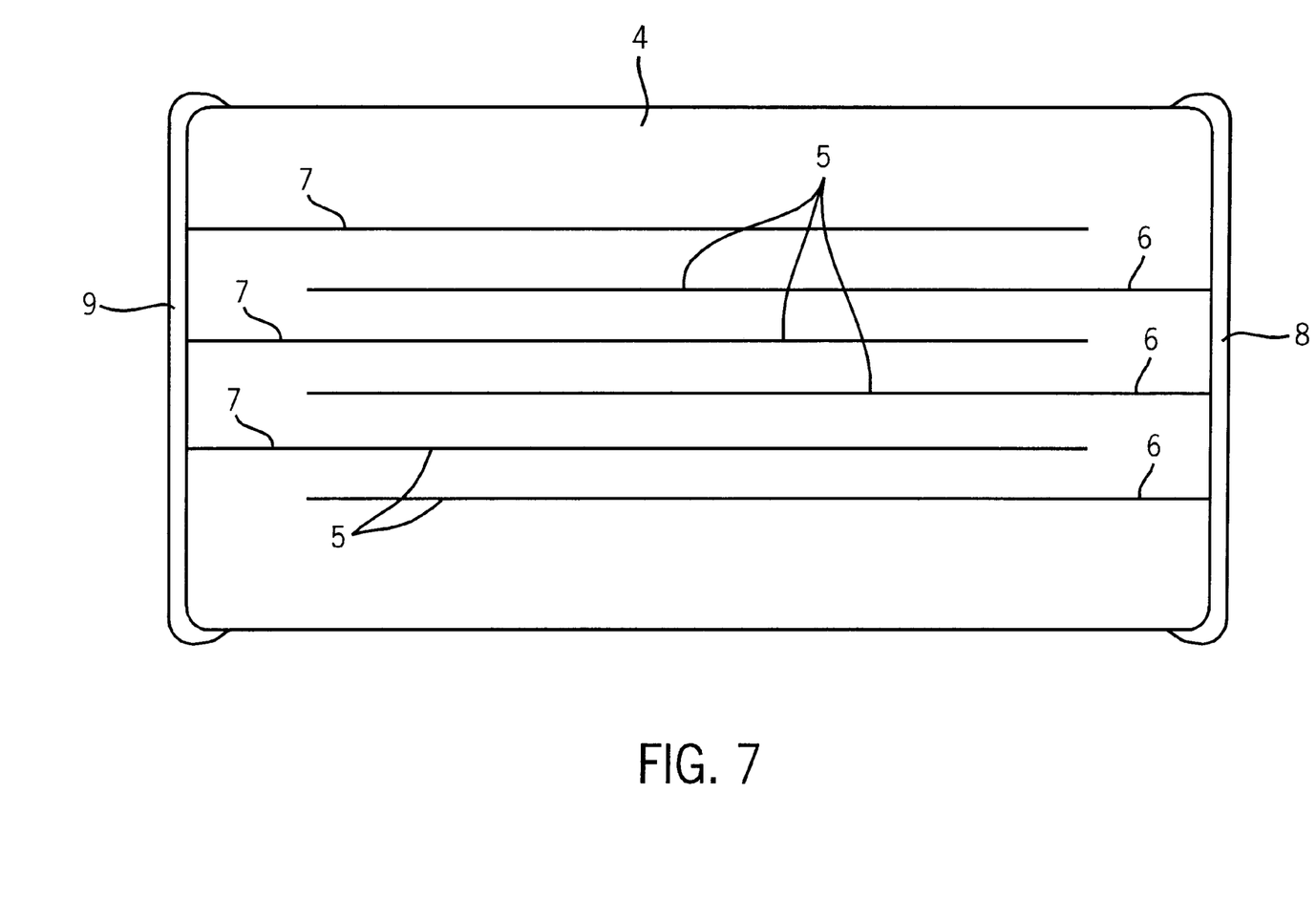
FIG. 7 is schematic diagram of another embodiment of the present invention.

Optimal ZnO diode forming structure having preferred properties is multilayer structure in from of chip (4) as shown in FIG. 7. Such structure is composed from a number of equally thin (15–300 μm) polycrystalline layers (5) among which thin (5–15 μm) metal layers (Ag, Pd, Pt, mixtures or alloys thereof in various proportions) are placed—inner electrodes (6), (7) in such manner, that each second electrode is shifted in opposite direction, so only one, the smallest edge ends in the smallest lateral side of the chip. Other edges of inner electrodes are surrounded with polycrystalline material. All inner electrodes ending on one side of the chip (6) are mutually connected with metal layer, which represents outer electrode (8). Similar description may be applied for all inner electrodes, ending on the opposite side of the chip (7). Outer electrodes on both lateral sides of the chip (8), (9) provide mutual electrical connection between every second inner electrodes in such manner, that between outer electrodes of the chip, parallel connection of ZnO polycrystalline diodes, represented by thin polycrystalline layer (5) with corresponding electrodes on each side (6) and (7) exists. All polycrystalline and inner metal layers together form compact low porous monolith structure.

Basic electrical parameters (i.e. breakthrough voltage and capacitance of ZnO diode) may be influenced by parameters of multilayer structure.

Breakthrough voltage $V_N$ depends on ZnO grains number in the cross section of the polycrystalline layer between two adjacent inner electrodes and its thickness respectively. Combination of ZnO grains dimension and layer thickness may provide breakthrough voltage in range from 4 V to 150 V. Capacitance $C_N$ depends on dielectric constant of polycrystalline material, in our case varying in range $\in$=900–1400, depending on thickness and number of polycrystalline layers in the structure. Therefore it is possible to provide capacitance in range from 100 pF–100 nF with real chip dimensions from 1 mm to 10 mm. Capacitance linearly decreases with increasing of DC voltage in whole operating range of voltage. This provides controllable altering from 10% to 30%.

For manufacturing of ZnO polycrystalline diodes we used mixture of oxide material dusts of following structure and weight percentage: ZnO—(91.75%), $Bi_2O_3$—(3%), $Sb_2O_3$—(3.5%), $Mn_3O_4$—(0.8%), $Co_3O_4$—(0.7%), $Fe_2O_3$—(0.05%) in $Nb_2O_5$—(0.2%). After homogenisation the materials were prereacted at 650° C. for two hours. After grinding and drying, an organic system composed of organic binders, plastificator, dispersive, solvent and other additives to forming stable suspension, was added into the above mentioned mixture. After 20 hours stirring, the suspension was used for pouring of thin foil with 30–60 μm thickness, using Doctor blade System. Foils were dried 48 hours and cut to smaller sheets of 13×13 cm, which were later used to form multilayer structure. Inner electrodes, made of silver (85%) and palladium (15%) were placed on the foils with printing technique. In this way formed multilayer structure was then pressed ($2 \times 10^4$ KPa, 70° C.) and compact blocks were formed.

Blocks were cut into chips, which were then treated in rotating drum, to round edges. After degasification of organic materials at 600° C. the chips were scorched-sintered at 1050° C. temperature. Silver electrodes, separately scorched at 620° C., were placed on sintered chips. Groups A and B of ZnO diode chips, all having same dimension (5,7 mm×5 mm), equal number of inner electrodes, but different polycrystalline layer thickness between adjacent inner electrodes, namely 35 μm and 100 μm, were made using above described procedure. Basic electric results of both ZnO diodes are shown in Table 1.

TABLE 1

| | Electric parameters of ZnO diode | | | | |
|---|---|---|---|---|---|
| Diode | Layer thickness (μm) | $V_N$ (V) | α 1–10 mA | C nF | δC/C % |
| A | 35 | 8.2 | 24 | 16 | 9.8 |
| B | 100 | 34 | 36 | 10 | 18 |

Above results show, that new ZnO polycrystalline diode of this invention, regardless to the thickness of the polycrystalline layer and value of breakthrough voltage, has high value of non-linearity coefficient α. Further more, the breakthrough voltage is very stable. Temperature coefficient $T_k$ measured for diode A was $T_k$=−0.001%/° C., while it was for diode B $T_k$=−0.01%/° C. Diodes may hold high current and energetic loads without significant consequences. For instance diode B holds current load over 2000 A at 8/20 μs impulse or 20 J of energetic load at 10/1000 μs impulse. Above results show that new ZnO diode of the present invention may be successfully used as protective element against electrostatic discharge and voltage and current strokes.

Figure 8A:
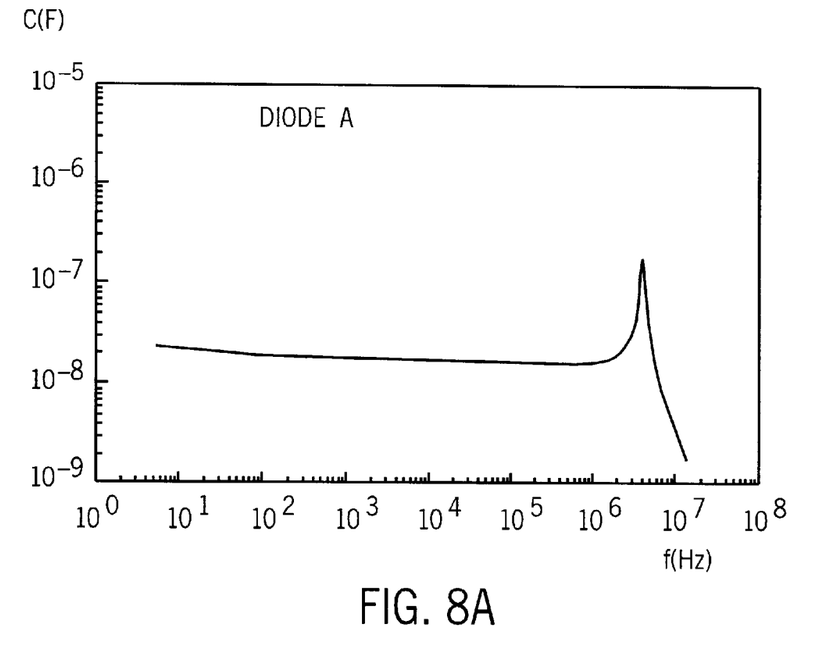
FIGS. 8A and 8B are graphs illustrating characteristics of the present invention.
Figure 8B:
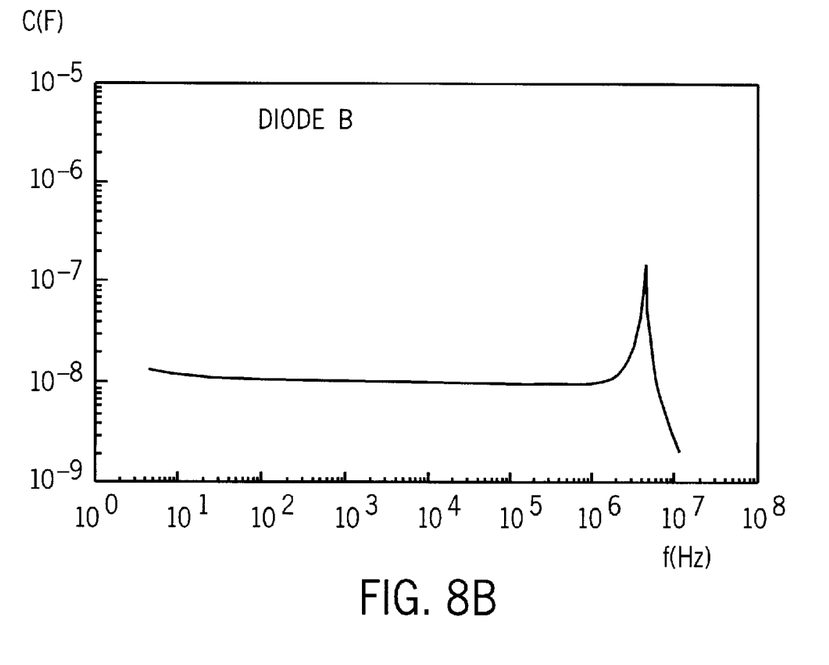
Figure 9A:
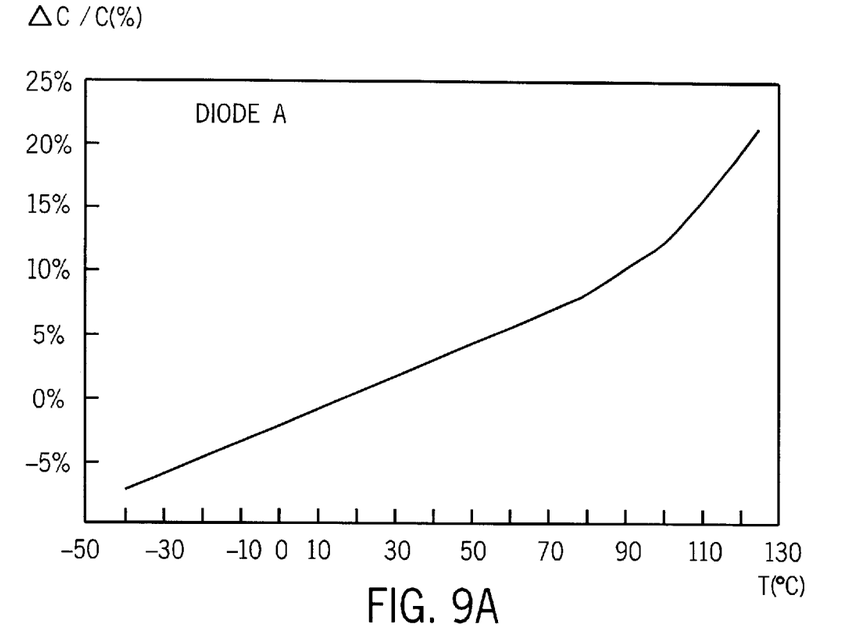
FIGS. 9A and 9B are graphs illustrating characteristics of the present invention.
Figure 9B:
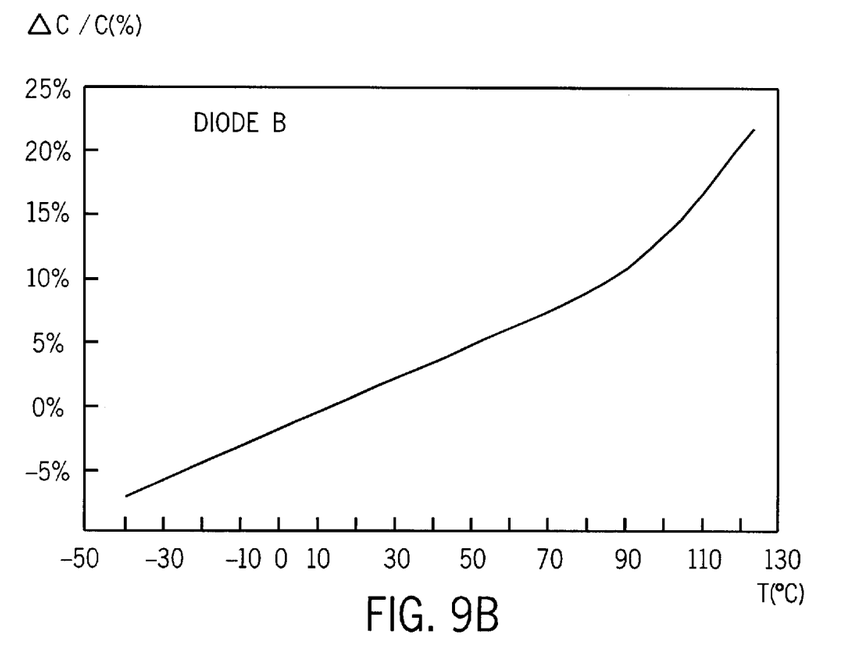
Figure 10A:
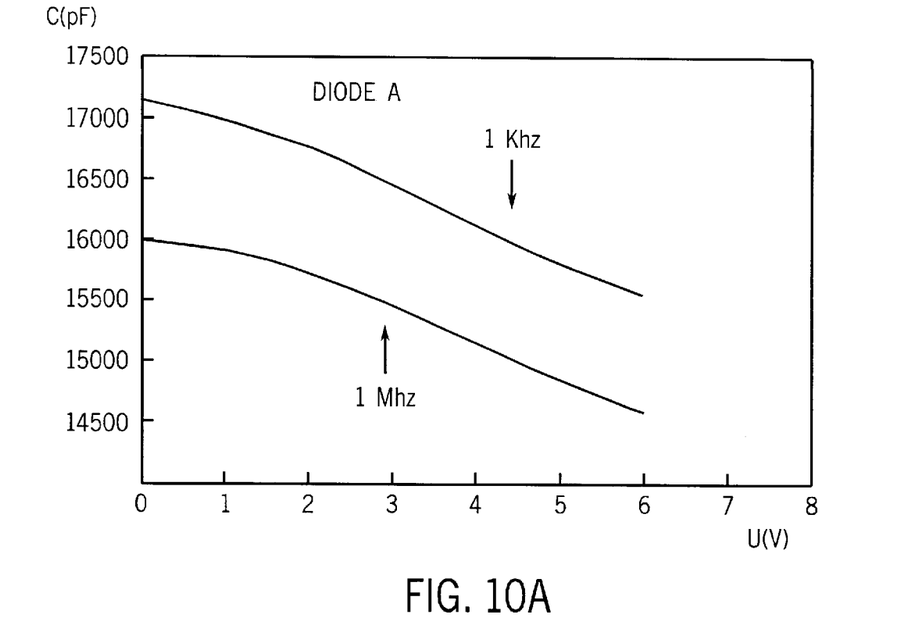
FIGS. 10A and 10B are graphs further illustrating characteristics of the present invention.
Figure 10B:
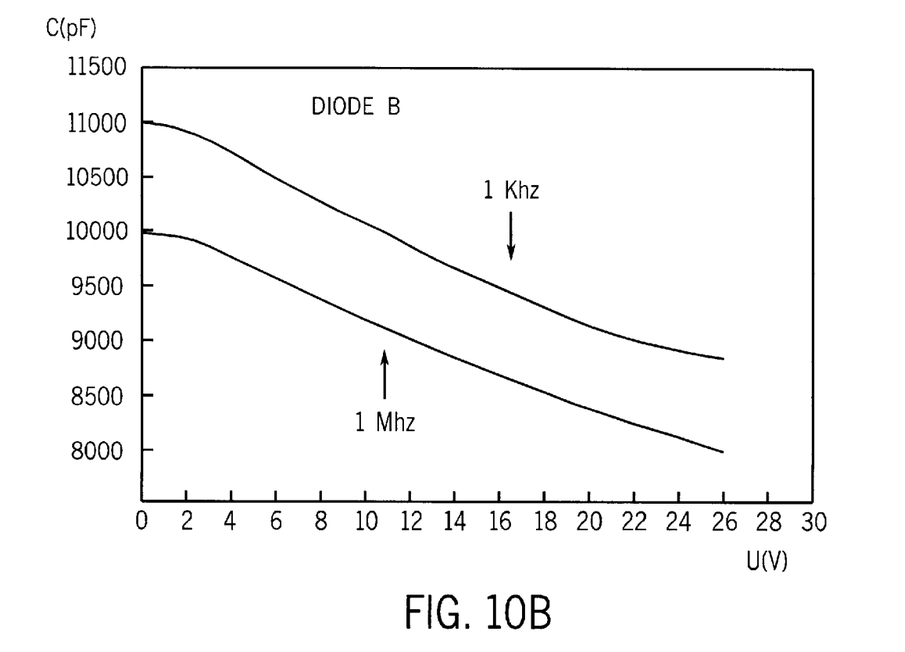

Capacitance of ZnO diodes A and B differs only by factor of difference of polycrystalline layer thickness. This means, that dielectric constant value of described material of ZnO diode, under conditions of stable processing is stable as well. Beside that capacitance in both cases (diodes A and B) is very stable infrequency range up to 1 Mhz, as shown in FIGS. 7 and 8. In temperature range from −40 to +85° C. capacitance of this new ZnO diode is linearly increasing with temperature. Change of capacitance amounts only to ±8%. Further increasing of temperature results in less linear temperature-capacitance dependence, as shown in FIG. 9. At 125° C. temperature, capacitance change comes to less than 23%. Above results show that this new ZnO diode may also be used as condenser, especially in higher temperature range, because ZnO is not limited with Curry temperature as the most commonly used dielectric $BaTiO_3$. When ZnO diode is used as condenser, it's highest operating voltage is limited with breakthrough voltage of the diode, the operating temperature being 20–25% lower. If voltage higher than condenser operating voltage occurs the diode goes towards breakthrough, so practically protecting "it's" condenser. This provides self-protection of the condenser. Further more the ZnO diode may be used not only as condenser, but even as controllable altered condenser. FIG. 10 shows capacitance-voltage dependence of diodes A and B. With exception of lower voltage values, this change is linear in the whole operating voltage range of the condenser, and it amounts to 9.8% for diode A and 19.5% for diode B.

Subject of this invention, multilayer ZnO polycrystalline diode, is new element that simultaneously combines functions of three different elements, namely protective Si diode, Si varactor diode and condenser.

What is claimed is:

1. A multilayer ZnO polycrystalline diode that protects against electrostatic discharges, over-current, and voltage surges comprising:
   a polycrystalline system formed by a network of elementary ZnO diodes, each elementary ZnO diode comprising at least one ZnO grain and a balance layer of $Bi_2O_3$ surrounding the at least one ZnO grain, wherein the polycrystalline system is formed into a block having a first lateral side and a second lateral side, and a plurality of polycrystalline parallel layers, wherein each layer comprises:
   ZnO;
   $Bi_2O_3$ in the range of 2.5 to 4% by weight;
   $Sb_2O_3$ in the range of 0 to 5% by weight;
   $Co_3O_4$ in the range of 0.6 to 0.9% by weight;
   $Mn_3O_4$ in the range of 0.6 to 1.2% by weight;
   $Nb_2O_5$ in the range of 0 to 0.4% by weight; and
   $Fe_3O_4$ in the range of 0 to 0.2% by weight.

2. The multilayer ZnO polycrystalline diode according to claim 1 having a direct polarization direction and an inverse polarization direction, wherein the multilayer ZnO polycrystalline diode provides a substantially nonlinear diode current versus diode voltage characteristic in both the direct polarization and the inverse polarization directions.

3. The multilayer ZnO polycrystalline diode according to claim 1 having a breakthrough voltage and wherein the polycrystalline system produces the substantially linear capacitance from 0 volts to approximately 80% of the breakthrough voltage.

4. The multilayer ZnO polycrystalline diode according to claim 1 wherein the substantially linear capacitance is provided over an operating frequency range from 0 to 2 MHZ and in a temperature range from −40° to 125° C.

5. The multilayer ZnO polycrystalline diode according to claim 1 further comprises:
   a plurality of inner electrodes, wherein each inner electrode includes metal and is placed among the plurality of parallel polycrystalline layers, and wherein one end of each inner electrode is placed to alternately terminate at one of the first lateral side and the second lateral side of the block, and wherein the remainder of each inner electrode is surrounded by the parallel polycrystalline layers; and
   a pair of outer electrodes, each outer electrode including metal and covering each of the first lateral side and the second lateral side of the block, such that the outer electrode of the first lateral side contacts and electrically connects each inner electrode terminating at the first lateral side of the block, and the outer electrode of the second lateral side contacts and electrically connects each inner electrode terminating at the second lateral side of the block.

6. The multilayer ZnO polycrystalline diode according to claim 1 wherein each polycrystalline layer has a thickness between 15 and 300 microns.

7. The multilayer ZnO polycrystalline diode according to claim 1 wherein the inner electrodes and the outer electrodes include at least two metals selected from the group consisting of Ag, Pd and Pt.

8. The multilayer ZnO polycrystalline diode according to claim 7 wherein the outer electrode includes approximately 85% Ag and approximately 15% Pd.

9. The multilayer ZnO polycrystalline diode according to claim 7 wherein the diode has a linearly increasing capacitance between at least a temperature range from −40° C. to +85° C.

10. A multilayer ZnO polycrystalline diode that protects against electrostatic discharges, over-current, and voltage surges comprising:
    a polycrystalline system formed by a network of elementary ZnO diodes, each elementary ZnO diode comprising at least one ZnO grain and a balance layer of $Bi_2O_3$ surrounding the at least one ZnO grain, wherein the polycrystalline system is formed into a plurality of layers; and
    wherein the polycrystalline system has a breakthrough voltage and produces a substantially linear capacitance from 0 volts to approximately 80% of the breakthrough voltage.

11. The multilayer ZnO polycrystalline diode according to claim 10 having a direct polarization direction and an inverse polarization direction, wherein the multilayer ZnO polycrystalline diode provides a substantially nonlinear diode current versus diode voltage characteristic in both the direct polarization and the inverse polarization directions.

12. The multilayer ZnO polycrystalline diode according to claim 10 wherein the substantially linear capacitance is provided over an operating frequency range from 0 to 2 MHZ and in a temperature range from −40° to 125° C.

13. The multilayer ZnO polycrystalline diode according to claim 10 further comprising:
    a block having the plurality of the polycrystalline layers in parallel and having a first lateral side and a second lateral side;
    a plurality of inner electrodes, wherein each inner electrode includes metal and is placed among the plurality of parallel polycrystalline layers, and wherein one end of each inner electrode is placed to alternately terminate at one of the first lateral side and the second lateral side of the block, and wherein the remainder of each inner electrode is surrounded by the parallel polycrystalline layers; and
    a pair of outer electrodes, each outer electrode including metal and covering each of the first lateral side and the second lateral side of the block, such that the outer electrode of the first lateral side contacts and electrically connects each inner electrode terminating at the first lateral side of the block, and the outer electrode of the second lateral side contacts and electrically connects each inner electrode terminating at the second lateral side of the block.

14. The multiplayer ZnO polycrystalline diode according to claim 13 wherein each parallel polycrystalline layer comprises:

ZnO;

Bi$_2$O$_3$ in the range of 2.5 to 4% by weight;

Sb$_2$O$_3$ in the range of 0 to 5% by weight;

Co$_3$O$_4$ in the range of 0.6 to 0.9% by weight;

Mn$_3$O$_4$ in the range of 0.6 to 1.2% by weight;

Nb$_2$O$_5$ in the range of 0 to 0.4% by weight; and

Fe$_3$O$_4$ in the range of 0 to 0.2% by weight.

15. The multilayer ZnO polycrystalline diode according to claim 13 wherein each polycrystalline layer has a thickness between 15 and 300 microns.

16. The multilayer ZnO polycrystalline diode according to claim 13 wherein the inner electrodes and the outer electrodes include at least two metals selected from the group consisting of Ag, Pd and Pt.

17. The multilayer ZnO polycrystalline diode according to claim 16 wherein the outer electrode includes approximately 85% Ag and approximately 15% Pd.

18. The multilayer ZnO polycrystalline diode according to claim 16 wherein the diode has a linearly increasing capacitance between at least a temperature range from −40° C. to +85° C.

19. A multilayer ZnO polycrystalline diode that protects against electrostatic discharges, over-current, and voltage surges comprising:

a polycrystalline system formed by a network of elementary ZnO diodes, each elementary ZnO diode comprising at least one ZnO grain and a balance layer of Bi$_2$O$_3$ surrounding the at least one ZnO grain, wherein the polycrystalline system is formed into a plurality of layers; and wherein the polycrystalline system has a linearly increasing capacitance over an operating frequency range from 0 to 2 MHz.

20. The multilayer ZnO polycrystalline diode according to claim 19 having a direct polarization direction and an inverse polarization direction, wherein the multilayer ZnO polycrystalline diode provides a substantially nonlinear diode current versus diode voltage characteristic in both the direct polarization and the inverse polarization directions.

21. The multilayer ZnO polycrystalline diode according to claim 19 wherein the linear increasing capacitance is provided in a temperature range from −40° to 125° C.

22. The multilayer ZnO polycrystalline diode according to claim 19 having a breakthrough voltage and wherein the polycrystalline system produces the substantially linear capacitance from 0 volts to approximately 80% of the breakthrough voltage.

23. The multilayer ZnO polycrystalline diode according to claim 19 further comprising:

a block having the plurality of the polycrystalline layers in parallel and having a first lateral side and a second lateral side;

a plurality of inner electrodes, wherein each inner electrode includes metal and is placed among the plurality of parallel polycrystalline layers, and wherein one end of each inner electrode is placed to alternately terminate at one of the first lateral side and the second lateral side of the block, and wherein the remainder of each inner electrode is surrounded by the parallel polycrystalline layers; and a pair of outer electrodes, each outer electrode including metal and covering each of the first lateral side and the second lateral side of the block, such that the outer electrode of the first lateral side contacts and electrically connects each inner electrode terminating at the first lateral side of the block, and the outer electrode of the second lateral side contacts and electrically connects each inner electrode terminating at the second lateral side of the block.

24. The multiplayer ZnO polycrystalline diode according to claim 23 wherein each parallel polycrystalline layer comprises:

ZnO;

Bi$_2$O$_3$ in the range of 2.5 to 4% by weight;

Sb$_2$O$_3$ in the range of 0 to 5% by weight;

Co$_3$O$_4$ in the range of 0.6 to 0.9% by weight;

Mn$_3$O$_4$ in the range of 0.6 to 1.2% by weight;

Nb$_2$O$_5$ in the range of 0 to 0.4% by weight; and

Fe$_3$O$_4$ in the range of 0 to 0.2% by weight.

25. The multilayer ZnO polycrystalline diode according to claim 23 wherein each polycrystalline layer has a thickness between 15 and 300 microns.

26. The multilayer ZnO polycrystalline diode according to claim 23 wherein the inner electrodes and the outer electrodes include at least two metals selected from the group consisting of Ag, Pd and Pt.

27. The multilayer ZnO polycrystalline diode according to claim 26 wherein the outer electrode includes approximately 85% Ag and approximately 15% Pd.

28. The multilayer ZnO polycrystalline diode according to claim 23 wherein the diode has a linearly increasing capacitance between at least a temperature range from −40° C. to +85° C.

* * * * *

UNITED STATES PATENT AND TRADEMARK OFFICE
CERTIFICATE OF CORRECTION

PATENT NO. : 6,316,819 B1
DATED : November 13, 2001
INVENTOR(S) : Zoran Zivic

It is certified that error appears in the above-identified patent and that said Letters Patent is hereby corrected as shown below:

Column 4,
Lines 11 and 29, delete "=" and substitute therefor -- $\cong$ --;
Line 63, delete "$\geqq$" and substitute therefor -- $\geq$ --.

Signed and Sealed this

Twenty-eighth Day of May, 2002

Attest:

JAMES E. ROGAN
*Attesting Officer*     *Director of the United States Patent and Trademark Office*